(12) United States Patent
Okada et al.

(10) Patent No.: US 7,616,939 B2
(45) Date of Patent: Nov. 10, 2009

(54) RECEIVER AND ELECTRONIC DEVICE USING THE SAME

(75) Inventors: Eiji Okada, Osaka (JP); Hiroaki Ozeki, Osaka (JP)

(73) Assignee: Panasonic Corporation, Osaka (JP)

( * ) Notice: Subject to any disclaimer, the term of this patent is extended or adjusted under 35 U.S.C. 154(b) by 441 days.

(21) Appl. No.: 10/588,109

(22) PCT Filed: Jan. 23, 2006

(86) PCT No.: PCT/JP2006/000937

§ 371 (c)(1),
(2), (4) Date: Jul. 31, 2006

(87) PCT Pub. No.: WO2006/078009

PCT Pub. Date: Jul. 27, 2006

(65) Prior Publication Data

US 2007/0167143 A1   Jul. 19, 2007

(30) Foreign Application Priority Data

Jan. 24, 2005  (JP) ............................. 2005-015083

(51) Int. Cl.
*H04B 1/16* (2006.01)
*H04M 1/00* (2006.01)

(52) U.S. Cl. .................. 455/340; 455/343.2; 455/307; 455/574

(58) Field of Classification Search ................ 455/296, 455/307, 310, 311, 312, 339, 340, 231, 343.1, 455/343.2
See application file for complete search history.

(56) References Cited

U.S. PATENT DOCUMENTS

| | | | | |
|---|---|---|---|---|
| 5,572,163 A * | 11/1996 | Kimura et al. | ............... | 327/553 |
| 5,726,599 A * | 3/1998 | Genest | ........................ | 327/553 |
| 5,745,001 A * | 4/1998 | Ueshima et al. | ............. | 327/553 |
| 5,760,702 A * | 6/1998 | Ito et al. | .................. | 340/825.2 |
| 6,107,870 A * | 8/2000 | Kawano | ...................... | 327/553 |
| 6,169,751 B1 * | 1/2001 | Shirakata et al. | ............ | 370/480 |
| 6,363,101 B1 * | 3/2002 | Sudo et al. | ................... | 375/147 |
| 6,388,510 B2 * | 5/2002 | Hayashi et al. | ............. | 327/552 |
| 6,400,932 B1 * | 6/2002 | Oh et al. | ................... | 455/150.1 |
| 6,593,803 B2 * | 7/2003 | Yoshizawa | ................... | 327/553 |
| 6,778,023 B2 * | 8/2004 | Christensen | ................. | 331/16 |
| 7,035,309 B2 * | 4/2006 | Sudo et al. | ................... | 375/130 |
| 2002/0057750 A1 * | 5/2002 | Nakao et al. | ................. | 375/345 |
| 2004/0097212 A1 * | 5/2004 | Matsumoto et al. | ......... | 455/296 |

(Continued)

FOREIGN PATENT DOCUMENTS

JP          3-034717          2/1991

(Continued)

*Primary Examiner*—Duc M Nguyen
(74) *Attorney, Agent, or Firm*—Wenderoth, Lind & Ponack, LLP.

(57) ABSTRACT

A receiver and an electronic device are provided that suppress deterioration of the signal waveform of a symbol. The receiver has a filter that sends out an output signal having a symbol at an arbitrary time interval; and an intermittent operation part that controls the filter intermittently at an arbitrary time interval, according to an output signal supplied from the filter. This arrangement prevents deterioration of the signal waveform of a symbol, by setting the timing for switching the signal for controlling the frequency characteristic of the filter, to an arbitrary period between symbol periods such as a guard interval.

10 Claims, 8 Drawing Sheets

U.S. PATENT DOCUMENTS

2006/0001482 A1 1/2006 Nakamura et al.
2008/0169948 A1* 7/2008 Okamoto et al. ............ 341/118

FOREIGN PATENT DOCUMENTS

| JP | 3-060287 | | 3/1991 |
|---|---|---|---|
| JP | 7-307643 | | 11/1995 |
| JP | 10-243338 | | 9/1998 |
| JP | 2001-308683 | | 11/2001 |
| JP | 2003-060485 | | 2/2003 |
| JP | 2003-188683 | * | 7/2003 |
| WO | 2004/047291 | | 6/2004 |

* cited by examiner

RECEIVER AND ELECTRONIC DEVICE USING THE SAME

TECHNICAL FIELD

The present invention relates to a receiver incorporating a frequency adjusting circuit for adjusting the frequency characteristic of a filter, and to an electronic device using the receiver.

BACKGROUND ART

Conventionally, for demodulating modulated digital signals favorably in an electronic device such as a communication instrument and audiovisual equipment, a mutual conductance-capacitance filter (referred to as "gm-C filter" hereinafter) or the like has been adopted that adjusts the frequency characteristic with a high degree of accuracy and is ideal for implementing in semiconductor chip form. A gm-C filter generally incorporates a frequency adjusting circuit for adjusting the frequency characteristic to suppress its changes caused by manufacturing variation of semiconductor ICs and by changes in ambient temperature.

Figure 9:
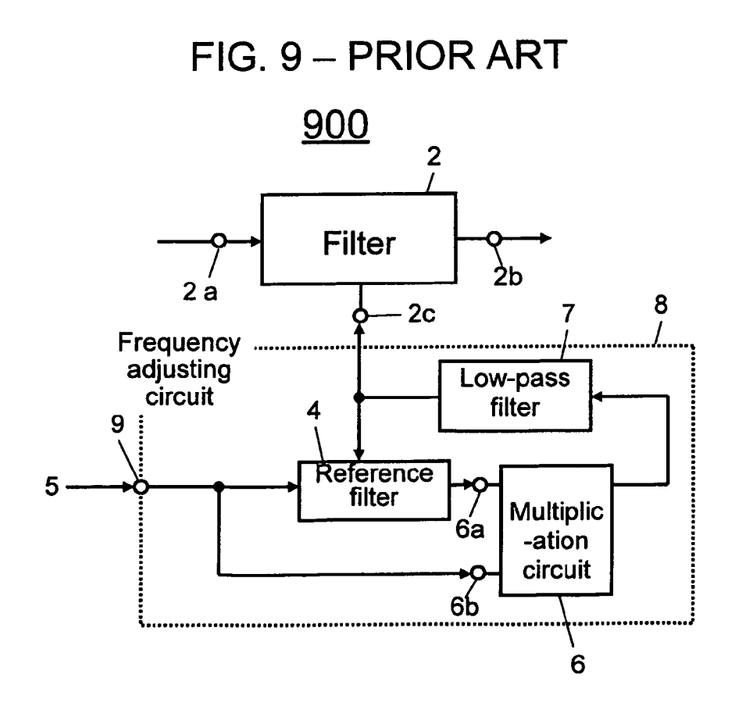
FIG. 9 is a block diagram of a receiver incorporating a conventional frequency adjusting circuit.

FIG. 9 illustrates an example of a receiver incorporating a conventional frequency adjusting circuit. Receiver 900 has filter 2 made of a gm-C filter. Filter 2 has input terminal 2a, output terminal 2b, and control terminal 2c. Input terminal 2a is supplied with an input signal before the frequency characteristic is adjusted. Output terminal 2b outputs an output signal after the frequency characteristic is adjusted. Control terminal 2c is supplied with a control voltage for adjusting the frequency characteristic from a frequency adjusting circuit to be described later.

Frequency adjusting circuit 8 has input terminal 9, reference filter 4, multiplication circuit 6, and low-pass filter 7. Input terminal 9 is supplied with reference clock signal 5 generated by a crystal oscillator (not illustrated) or the like.

Reference clock signal 5 fed into input terminal 9 is input to reference filter 4. A reference clock signal supplied from reference filter 4 is input to first input terminal 6a of multiplication circuit 6. Reference clock signal 5 is input as is to second input terminal 6b of multiplication circuit 6.

Multiplication circuit 6 multiplies two reference clock signals having passed through different signal paths, and compares both phases to output a voltage according to the phase difference. When a voltage supplied from multiplication circuit 6 is input to low-pass filter 7, the voltage is smoothed there to be output as a control voltage. Providing negative feedback to the control voltage having been output to reference filter 4 causes formation of a phase control loop, to control the frequency characteristic of reference filter 4 with high accuracy and reproducibility. Reference filter 4 is composed of a secondary low-pass filter. When the phase control loop is locked, reference clock signal 5 passing through is phase-shifted by 90 degrees in reference filter 4.

A control voltage supplied from low-pass filter 7 is input to control terminal 2c as a control voltage for filter 2. The frequency characteristic of an input signal fed into input terminal 2a of filter 2 is adjusted with a high degree of accuracy to extract an output signal supplied from output terminal 2b. The extracted output signal is used for a demodulation process in the receiver, for example.

Prior art documents relating to the present patent application include Japanese Patent Unexamined Publication No. 2003-60485.

In the above-mentioned conventional arrangement, however, frequency adjusting circuit 8, composed of reference filter 4, multiplication circuit 6, and low-pass filter 7, needs to be activated to adjust the frequency characteristic of filter 2. Accordingly, a symbol, namely a signal waveform of data composed of one or more bits, transmittable in one modulation, deteriorates due to changes in the frequency characteristic of filter 2.

SUMMARY OF THE INVENTION

The present invention, in order to solve the above-mentioned conventional problems, provides a receiver and an electronic device that suppress deterioration of a signal waveform for a symbol.

A receiver according to the present invention has a filter for sending out an output signal having a symbol in every arbitrary time interval; and an intermittent operation part for controlling the filter intermittently at given time intervals according to an output signal supplied from the filter.

The invention suppresses deterioration of a signal waveform for a symbol by setting a period between symbol periods such as a guard interval, as timing for changing a signal for controlling the frequency characteristic of the filter, to an arbitrary time period.

The receiver according to the present invention specifically has a filter for sending out an output signal having a symbol in every arbitrary time interval; and an intermittent operation part for controlling the filter intermittently according to an output signal supplied from the filter.

The receiver of the present invention further has a timing signal generator for generating a timing signal for turning on and off the power supply of the intermittent operation part, according to an arbitrary time interval in an output signal supplied from the filter.

In the receiver of the present invention, the timing signal generator generates a timing signal for turning on and off the power supply of the intermittent operation part, according to a control signal from the intermittent operation part.

The timing signal generator incorporated in the receiver of the present invention generates a timing signal for turning on and off the power supply of the intermittent operation part, according to the signal strength of a control signal from the intermittent operation part.

In the receiver of the present invention, the timing signal generator generates a timing signal for turning on and off the power supply of the intermittent operation part, according to a control signal from the intermittent operation part and a power off period of the intermittent operation part.

The receiver of the present invention has a register for holding a control signal from the intermittent operation part; the filter is controlled according to a control signal held by the register; and the timing signal generator generates a timing signal for turning on and off the power supply of the intermittent operation part, according to a reference clock signal in addition to an arbitrary time interval in an output signal.

In the receiver of the present invention, the frequency adjusting circuit has a reference filter for setting a phase difference to the reference clock signal; a multiplication circuit for multiplying an output signal supplied from the reference filter by the reference clock signal; and a low-pass filter connected to the output of the multiplication circuit. Further, the frequency adjusting circuit provides the reference filter with an output voltage supplied from the low-pass filter, to provide the reference filter with negative feedback, so that the cutoff frequency of the reference filter remains constant. The frequency adjusting circuit further has a sample hold (SH) circuit for holding an output voltage supplied from the low-pass filter, for a constant period; and an analog-to-digital converter (ADC) for converting analog output voltage (analog data) supplied from the sample hold circuit, to digital data.

In addition, the frequency adjusting circuit has a digital-to-analog converter (DAC) for converting digital data to analog. The frequency adjusting circuit further has a register for holding the converted digital data to activate the frequency adjusting circuit intermittently according to the digital data held by the register.

The receiver of the present invention has a reference filter for setting a phase difference to the reference clock signal; an XOR circuit for outputting an exclusive OR between an output signal supplied from the reference filter and a reference clock signal; and a measurement circuit for measuring the duty ratio of an output signal supplied from the XOR circuit. The receiver of the present invention further has a register for using an output signal supplied from the measurement circuit as a control signal for the filter and for holding the output signal supplied from the measurement circuit as digital data. Such circuitry enables activation of the frequency adjusting circuit intermittently.

An electronic device according to the present invention is loaded with the above-mentioned receiver.

DETAILED DESCRIPTION OF PREFERRED EMBODIMENTS

First Exemplary Embodiment

Figure 1:
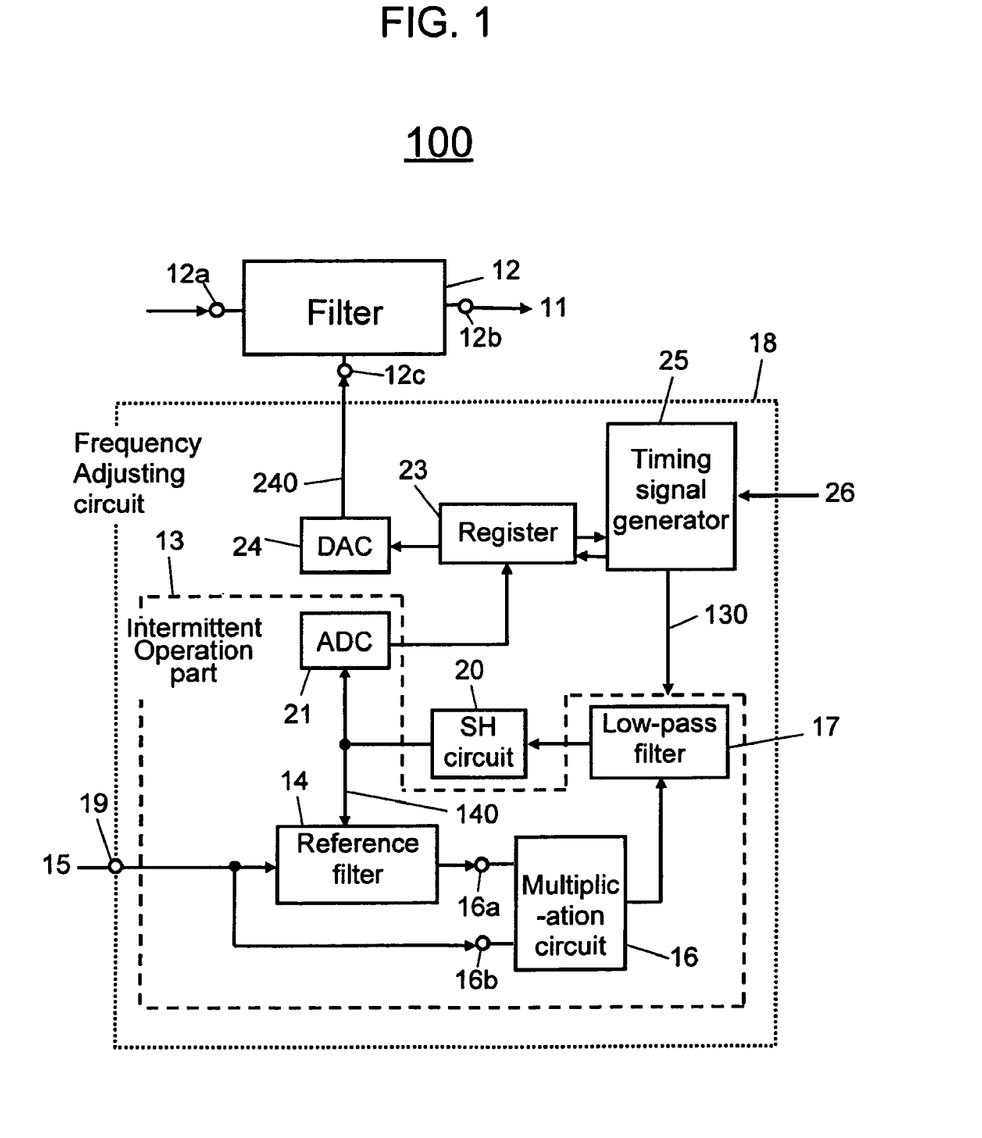
FIG. 1 is a block diagram of a receiver incorporating a frequency adjusting circuit according to the first exemplary embodiment of the present invention.

The first exemplary embodiment is described with reference to the related drawings. FIG. 1 is a block diagram of a receiver incorporating a frequency adjusting circuit according to the first exemplary embodiment of the present invention.

Receiver 100 according to the present invention has filter 12 and frequency adjusting circuit 18.

Filter 12, made of a gm-C filter, has input terminal 12a to which an input signal is supplied, and output terminal 12b from which output signal 11 that is the input signal the frequency characteristic of which has been adjusted is extracted. Filter 12 further has control terminal 12c to which a control voltage for adjusting the frequency characteristic is supplied from frequency adjusting circuit 18. A control voltage for adjusting the frequency characteristic is input to control terminal 12c from a frequency adjusting circuit to be described later.

Frequency adjusting circuit 18 has intermittent operation part 13. Intermittent operation part 13 has input terminal 19, reference filter 14, multiplication circuit 16, low-pass filter 17, and ADC (analog-to-digital converter) 21. Reference clock signal 15 is input to reference filter 14 and multiplication circuit 16 through input terminal 19. The phase of reference clock signal 15 fed into reference filter 14 is shifted in reference filter 14 and is fed into first input terminal 16a of multiplication circuit 16. Second input terminal 16b of multiplication circuit 16 is supplied with reference clock signal 15 fed into input terminal 19 as is. Multiplication circuit 16 multiplies a phase-shifted signal by reference clock signal 15, and outputs a voltage corresponding to the phase difference between both of them. Low-pass filter 17 smooths an output voltage extracted from multiplication circuit 16. Sample hold (SH) circuit 20 holds a signal smoothed by low-pass filter 17 as analog data. The analog data held by SH circuit 20 is converted to digital data by ADC (analog-to-digital converter) 21.

The digital data converted by ADC 21 is input to register 23. The digital data held by register 23 is input to DAC (digital-to-analog converter) 24. DAC 24 converts the digital data extracted from register 23 to analog data.

Receiver 100 according to the present invention further has timing signal generator 25 to which guard interval signal 26 is input externally. Timing signal generator 25 controls intermittent operation part 13 and register 23. A guard interval signal has a longer symbol length than its theoretical one, where the last part of the symbol is added to its top to prevent an influence of a delayed wave.

Figure 2:
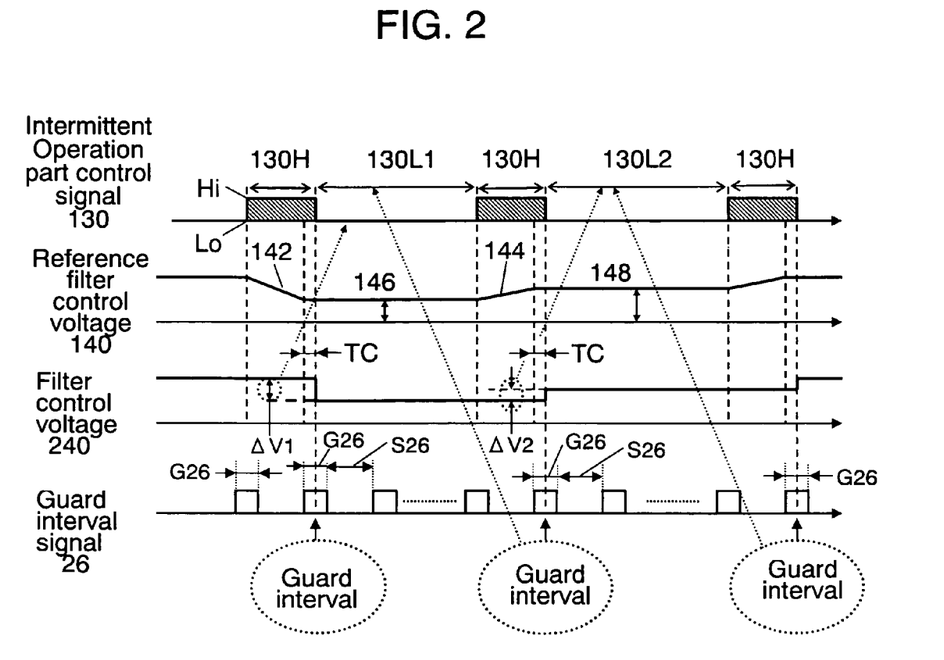
FIG. 2 is a timing chart of the receiver incorporating the frequency adjusting circuit according to the first exemplary embodiment of the present invention.

FIG. 2 is an operation timing chart of frequency adjusting circuit 18 shown in FIG. 1. Intermittent operation part control signal 130, supplied from timing signal generator 25, controls on/off operation of intermittent operation part 13. Intermittent operation part 13 is on during on period 130H (Hi level) and is off during off periods 130L1 (Lo level) and 130L2 (Lo level), of intermittent operation part control signal 130. Here in the first exemplary embodiment, the off period is divided into two periods such as 130L1 and 130L2, in order to adjust the off period according to changes in the control voltage for the reference filter, to be described later. The number of off periods is not limited to two, but three or more may be provided.

Reference filter control voltage 140, extracted from SH circuit 20, controls the operation of reference filter 14. When intermittent operation part 13 is in an on state, namely when intermittent operation part control signal 130 is in on period 130H, reference filter control voltage 140 converges in given convergence periods 142, 144, and then given voltage level 146 or 148 after constant period TC has elapsed is held by SH circuit 20. Meanwhile, ADC 21 converts analog data to digital data in constant period TC. The length of constant period TC depends on guard interval G26.

Filter control voltage 240 is extracted from the output side of DAC 24 and fed into control terminal 12c of filter 12. Reference filter control voltage 140 extracted from SH circuit 20 is converted to digital data by ADC (analog-to-digital converter) 21. The digital data is held by register 23 to be input to DAC 24. Filter control voltage 240 extracted from DAC 24 controls filter 12.

The digital data fed into DAC 24 and the immediately preceding one are used to calculate change amounts ΔV1, ΔV2 of the control voltage for reference filter 14. Off period 130L1 is to be set short for large ΔV1; and long for small ΔV1. Meanwhile, the same idea applies to change amount ΔV2 of the control voltage for reference filter 4. That is, off period 130L2 is to be set short for large ΔV2; and long for small ΔV2. Here, an example of a method of extracting off periods 130L1, 130L2 from the change amount of the control voltage, involves preparing a setting table showing a relationship between off periods and change amounts of the control voltage. The period during which DAC 24 converts digital data to analog data is constant period TC.

In the first exemplary embodiment of the present invention, timing for controlling filter 12 utilizes a guard interval adopted in, for example, digital terrestrial television broadcasting. The guard interval is defined as "arbitrary time interval" in the present invention. This "arbitrary time interval" may be either constant or variable. Adopting either arrangement in the above prevents deterioration of the signal waveform of a symbol, by setting the timing for switching the signal for controlling the frequency characteristic of filter 12, to an arbitrary period between symbol periods such as guard interval G26.

Guard interval signal 26 is input to timing signal generator 25. Guard interval signal 26 has effective symbol period S26 and guard interval G26. A symbol period can be defined as (S26+G26), which is a sum of effective symbol period S26 and guard interval G26. Here, a symbol period is a period for data of one or more bits transmittable in one modulation.

Timing signal generator 25 may receive an output signal supplied from filter 12; turn on the power supply of intermittent operation part 13 before a given period to guard interval G26 of the output signal; and turn off the power supply of intermittent operation part 13 after intermittent operation part 13 completes controlling filter 12. This brings lower power consumption of intermittent operation part 13.

Further, timing signal generator 25 may detect guard interval G26 of guard interval signal 26 externally supplied; hold the digital data by register 23 synchronously with the guard interval G26; and input a control voltage to filter 12 by DAC 24. This allows intermittent operation part 13 to supply filter 12 with a control signal even during periods 130L1, 130L2, during which intermittent operation part 13 is off.

Next, a description is made for a period during which intermittent operation part 13 is in an off state. After switching the control voltage for filter 12, intermittent operation part 13 enters an off state. A period during which intermittent operation part 13 is off is determined by timing signal generator 25 in the following way. The digital data currently being fed into DAC 24 and the immediately preceding one are used to calculate change amount ΔV1 or ΔV2 of the control voltage for reference filter 14. Off period 130L1 or 130L2 is to be set short for a large change amount; and long for a small change amount. FIG. 2 exemplifies a case where ΔV1 is larger than ΔV2 and off period 130L1 is shorter than 130L2, as an example. An example of a method of extracting an off period from the change amount of the control voltage, involves preparing a setting table showing a relationship between off periods and change amounts of the control voltage.

In this way, as a result of timing signal generating 25 generates a timing signal for turning on and off the power supply of intermittent operation part 13 according to a control signal from intermittent operation part 13, the power consumption of intermittent operation part 13 is suppressed to a low level.

Further, as a result of intermittent operation part 13 holding a control voltage held by SH circuit 20 during on period 130H even during off periods 130L1, 130L2, the control voltage is used as an initial voltage for the next operation period. Such an arrangement shortens convergence periods 142, 144, and so does the operating time of intermittent operation part 13.

SH circuit 20 holding a control voltage as an analog value is composed between a low-pass filter and a reference filter, and thus the control voltage passes through SH circuit 20 as is when frequency adjusting circuit 18 is on. Accordingly, when intermittent operation part 13 turns off, a control voltage before the turning off is to be held. Consequently, the control voltage before the turning off provides negative feedback when an on action resumes, to shorten the convergence period.

Second Exemplary Embodiment

Figure 3:
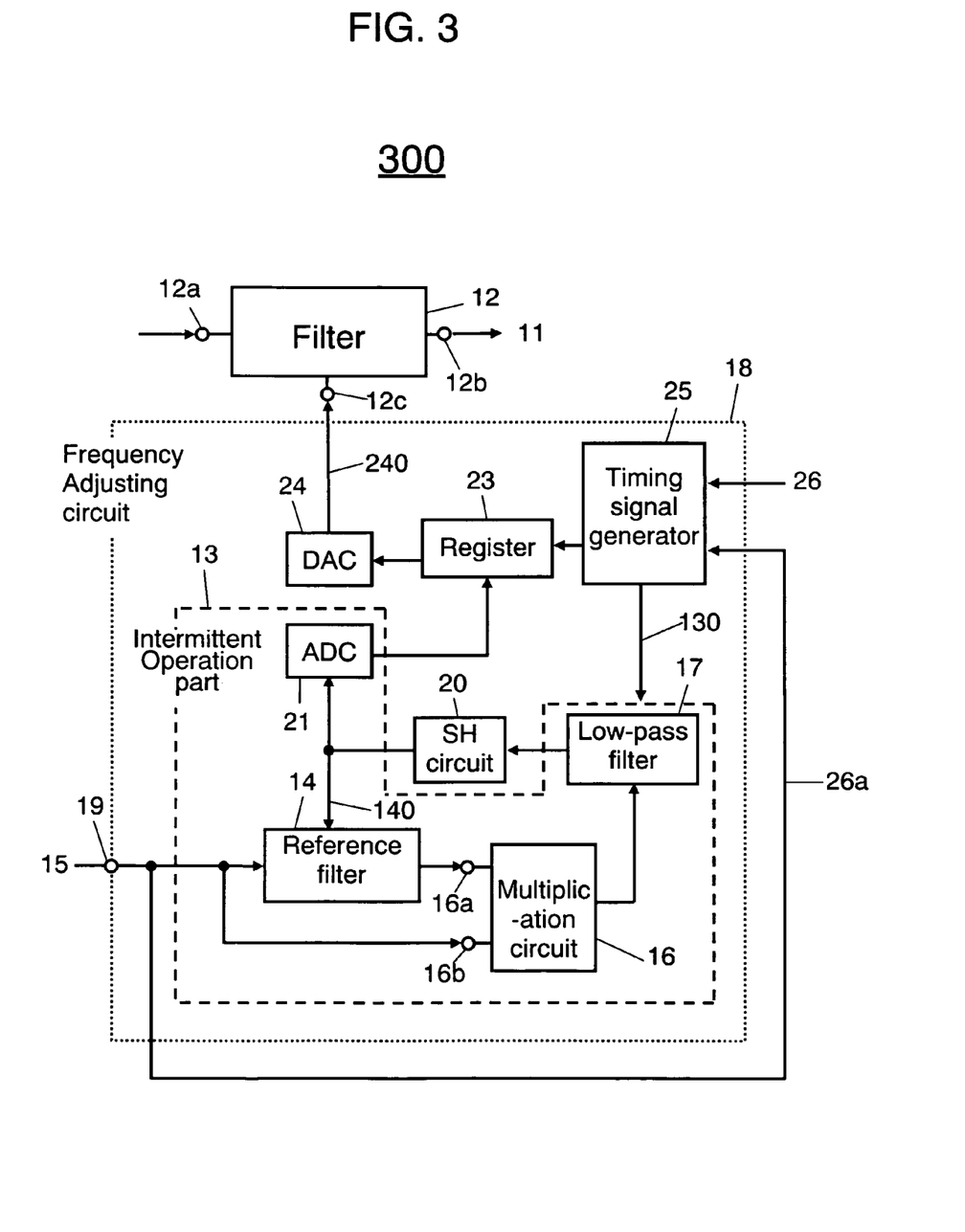
FIG. 3 is a block diagram of a receiver incorporating a frequency adjusting circuit according to the second exemplary embodiment of the present invention.

FIG. 3 is a block diagram of a receiver incorporating a filter and its frequency adjusting circuit, according to the second exemplary embodiment of the present invention.

Receiver 300 according to the second exemplary embodiment represents roughly the same circuit configuration and circuit operation as in the first exemplary embodiment (shown in FIG. 1). First, filter 12 made of a gm-C filter has input terminal 12a to which an input signal is supplied, and output terminal 12b from which an output signal that is the input signal with its frequency characteristic adjusted is extracted. Filter 12 further has control terminal 12c for adjusting the frequency characteristic of an input signal fed into input terminal 12a. Control terminal 12c is supplied with a control voltage from DAC 24 incorporated in frequency adjusting circuit 18 to be described later.

Receiver 300 has frequency adjusting circuit 18 incorporating intermittent operation part 13. Intermittent operation part 13 has input terminal 19, reference filter 14, multiplication circuit 16, low-pass filter 17, and ADC (analog-to-digital converter) 21. Frequency adjusting circuit 18 has SH circuit 20, register 23, and DAC (digital-to-analog converter) 24, in addition to intermittent operation part 13, as well as in the first exemplary embodiment.

Reference filter control voltage 140 and filter control voltage 240 are extracted from SH circuit 20 and DAC 24, respectively.

Receiver 300 further has timing signal generator 25. The input side of timing signal generator 25 is supplied with extraneous guard interval signal 26 and reference clock signal 15 through input terminal 19 and signal connection line 26a, respectively. The output side of timing signal generator 25 outputs intermittent operation part control signal 130 for controlling intermittent operation part 13.

Figure 4:
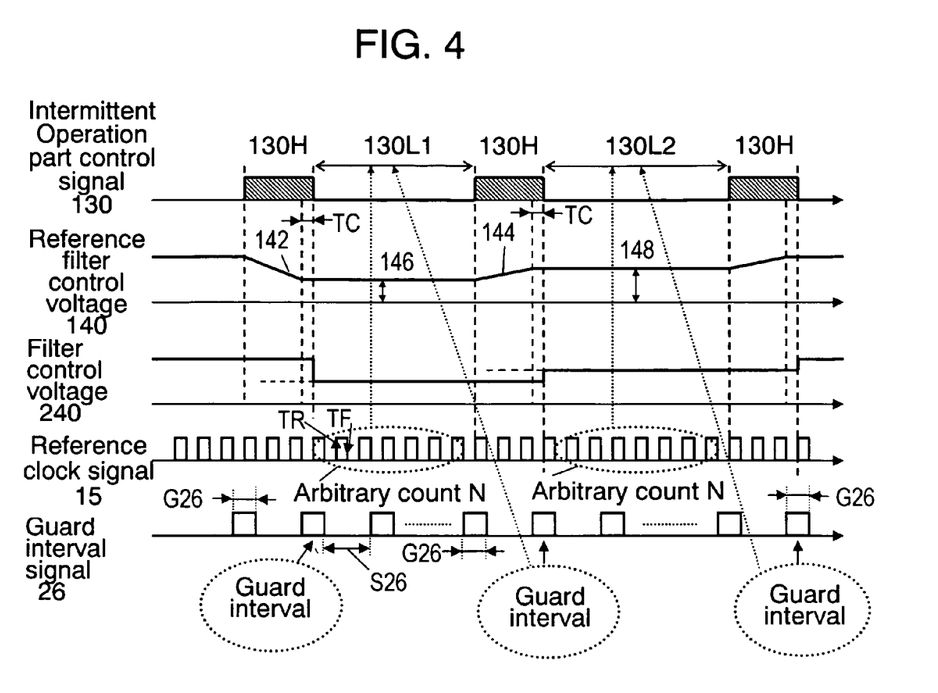
FIG. 4 is a timing chart of the receiver incorporating the frequency adjusting circuit according to the second exemplary embodiment of the present invention.

FIG. 4 is an operation timing chart of frequency adjusting circuit 18 shown in FIG. 3. Intermittent operation part control signal 130, supplied from timing signal generator 25, controls turning on and off of intermittent operation part 13. Intermittent operation part 13 is on during on period 130H (Hi level) and is off during off periods 130L1 (Lo level) and 130L2 (Lo level), of intermittent operation part control signal 130.

As aforementioned, reference filter control voltage 140, supplied from SH circuit 20, controls the actions of reference filter 14 and ADC 21. When intermittent operation part 13 is in an on state, namely when intermittent operation part control signal 130 is in on period 130H, reference filter control voltage 140 converges in given convergence periods 142, 144, and then after constant period TC has elapsed, given voltage level 146 or 148 is held by SH circuit 20. Meanwhile, ADC 21 converts analog data to digital data in constant period TC, The length of constant period TC depends on guard interval G26.

Filter control voltage 240 is extracted from DAC 24 and fed into control terminal 12c of filter 12 in order to control filter 12. The digital data fed into DAC 24 and the immediately preceding one are used to calculate change amounts $\Delta V1$, $\Delta V2$ of the control voltage for reference filter 14. Off period 130L1 or 130L21 is to be set short for large $\Delta V1$; and longer than the previous one for small $\Delta V2$. FIG. 4 exemplifies a case where $\Delta V1$ is larger than $\Delta V2$ and off period 130L1 is shorter than 130L2, as an example.

The second exemplary embodiment differs from the first one shown in FIG. 1 in that, in the second embodiment, reference clock signal 15 is input to timing signal generator 25.

Meanwhile, in the second exemplary embodiment as well as in the first one, timing for controlling filter 12 utilizes a guard interval adopted in, for example, digital terrestrial television broadcasting. The guard interval is defined as "arbitrary time interval" in the present invention. This "arbitrary time interval" may be either constant or variable. Adopting either arrangement in the above prevents deterioration of the signal waveform of a symbol, by setting the timing for switching the signal for controlling the frequency characteristic of filter 12, to an arbitrary period between symbol periods such as guard interval G26.

Guard interval signal 26 is input to timing signal generator 25. Guard interval signal 26 has effective symbol period S26 and guard interval G26. A symbol period is defined as (S26+G26), which is a sum of effective symbol period S26 and guard interval G26. Here, a symbol period is a period for data of one or more bits transmittable in one modulation.

Timing signal generator 25 may receive an output signal supplied from filter 12; turn on the power supply of intermittent operation part 13 before a given period to guard interval G26 of the output signal; and turn off the power supply of intermittent operation part 13 after intermittent operation part 13 completes controlling filter 12. This brings lower power consumption of intermittent operation part 13.

Further, timing signal generator 25 may detect guard interval G26 of guard interval signal 26 externally supplied; hold the digital data by register 23 synchronously with the guard interval G26; and input a control voltage to filter 12 by DAC 24. This allows intermittent operation part 13 to supply filter 12 with a control signal even during periods 130L1, 130L2, during which intermittent operation part 13 is off.

Next, a description is made for a period during which intermittent operation part 13 is in an off state, using the timing chart of FIG. 4. After the control voltage for filter 12, namely filter control voltage 240, is switched, intermittent operation part 13 enters an off state. A period during which intermittent operation part 13 is to be off is determined by timing signal generator 25 in the following way. An arrangement is made so that timing signal generator 25 counts rising edge TR or falling edge TF, of reference clock signal 15, and shifts intermittent operation part 13 to an on state when an arbitrary count N preliminarily set is reached. Here, arbitrary count N may be either a fixed value, or variable value such as a pseudo-random number. This arrangement brings the following advantages. That is, for a fixed value, the circuit scale and power consumption are reduced; and for a variable value, noise caused by a periodic fluctuation of the characteristic of the filter is suppressed owing to the nonperiodic switching timing.

Third Exemplary Embodiment

A description is made of the third exemplary embodiment with reference to the related drawings, although the description is repeated because its circuit has a lot of components similar to the first and second exemplary embodiments.

Figure 5:
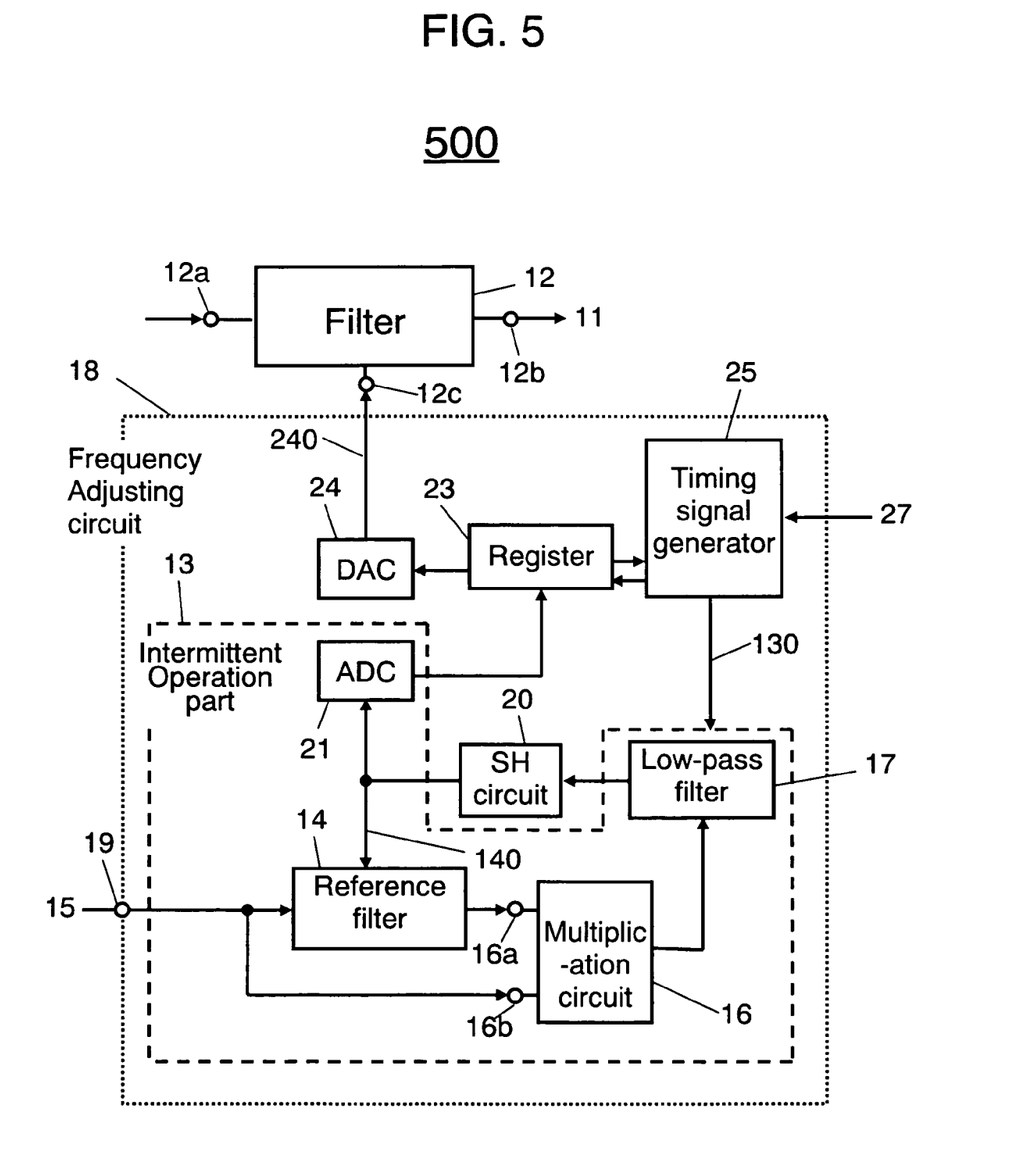
FIG. 5 is a block diagram of a receiver incorporating a frequency adjusting circuit according to the third exemplary embodiment of the present invention.

Receiver 500 according to the third exemplary embodiment, shown in FIG. 5, has filter 12 made of a gm-C filter, in the same way as in the first exemplary embodiment (shown in FIG. 1). Filter 12 has input terminal 12a to which an input signal is supplied, and output terminal 12b from which an output signal that is the input signal the frequency characteristic of which has been adjusted is extracted. Filter 12 further has control terminal 12c for adjusting the frequency characteristic of an input signal fed into input terminal 12a. A control voltage is input to control terminal 12c from DAC 24 to be described later.

Receiver 500 has frequency adjusting circuit 18 incorporating intermittent operation part 13. Intermittent operation part 13 has input terminal 19, reference filter 14, multiplication circuit 16, low-pass filter 17, and ADC (analog-to-digital converter) 21. Frequency adjusting circuit 18 has SH circuit 20, register 23, and DAC (digital-to-analog converter) 24, in addition to intermittent operation part 13, in the same way as in the first and second exemplary embodiments.

Receiver 500 further has timing signal generator 25. The input side of timing signal generator 25 is supplied with reception state signal 27. The output side of timing signal generator 25 outputs intermittent operation part control signal 130 for controlling intermittent operation part 13.

Reception state signal 27 has reception period R27 and non-reception period F27. When receiving a signal transmitted with a time division method, a demodulator arranged at a stage subsequent to receiver 500, using a signal supplied from output terminal 12b of filter 12, generates a signal indicating whether in reception period R27 or non-reception period F27 as Hi level or Lo level, respectively. DVB-H, a standard for digital terrestrial television broadcasting, for example, includes information on the time when the next signal is transmitted, in its reception signal, and thus can generate reception state signal 27 according to the information.

Figure 6:
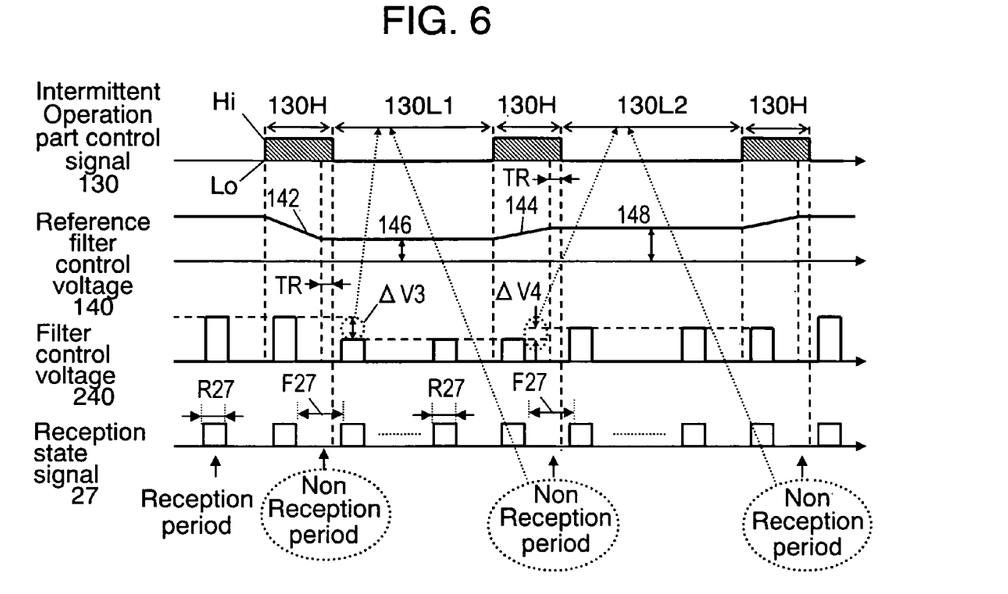
FIG. 6 is a timing chart of the receiver incorporating the frequency adjusting circuit according to the third exemplary embodiment of the present invention.

FIG. 6 is a timing chart of frequency adjusting circuit 18 shown in FIG. 5. Intermittent operation part control signal 130, supplied from timing signal generator 25 as aforementioned, controls turning on and off of intermittent operation part 13. Intermittent operation part 13 is on during on period 130H (Hi level) and is off during off periods 130L1 (Lo level) and 130L2 (Lo level), of the intermittent operation part control signal.

Reference filter control voltage 140, supplied from SH circuit 20, controls the actions of reference filter 14 and ADC 21. When intermittent operation part 13 is in an on state, namely when intermittent operation part control signal 130 is in on period 130H, reference filter control voltage 140 converges in given convergence periods 142, 144, and then after constant period TC has elapsed, given voltage level 146 or 148 is held by SH circuit 20. Meanwhile, ADC 21 converts analog data to digital data in constant period TC, The length of constant period TC depends on guard interval G26.

Reference filter control voltage 140 extracted from SH circuit 20 is converted to digital data by ADC (analog-todigital converter) 21. The digital data is held by register 23 to be input to DAC 24. Filter control voltage 240 extracted from DAC 24 controls filter 12.

Timing signal generator 25 according to the third exemplary embodiment differs from those in the first and second exemplary embodiments in that, in the third embodiment, a signal for controlling intermittent operation part 13 and register 23 is generated from multiple digital data held in register 23 and extraneous reception state signal 27 indicating a reception period.

Intermittent operation part control signal 130, supplied from timing signal generator 25, controls turning on and off of intermittent operation part 13. Intermittent operation part 13 is on during on period 130H (Hi level) and is off during off periods 130L1 (Lo level) and 130L2 (Lo level), of intermittent operation part control signal 130.

Reference filter control voltage 140, supplied from SH circuit 20, controls the actions of reference filter 14 and ADC 21. When intermittent operation part 13 is in an on state, namely when intermittent operation part control signal 130 is in on period 130H, reference filter control voltage 140 converges in given convergence periods 142, 144, and then after constant period TC has elapsed, given voltage level 146 or 148 is held by SH circuit 20. Meanwhile, ADC 21 converts analog data to digital data in constant period TC. The length of constant period TC depends on guard interval G26.

Filter control voltage 240, extracted from DAC 24, is fed into control terminal 12 of filter 12 in order to control filter 12.

The digital data fed into DAC 24 and the immediately preceding one are used to calculate change amounts ΔV3 and ΔV4 of the control voltage for reference filter 14. Off period 130L1 is to be set short for large change amount ΔV3; and long for small change amount ΔV3. Meanwhile, the same idea applies to change amount ΔV4 of the control voltage for reference filter 14. That is, off period 130L2 is to be set short for large ΔV4; and long for small ΔV4. Here, an example of a method of extracting off periods 130L1, 130L2 from the change amount of the control voltage involves preparing a setting table showing relationship between off periods and change amounts of the control voltage.

Next, a description is made for the actions of frequency adjusting circuit 18, using the timing chart of FIG. 6. Timing for converting digital data to analog values in DAC 24 utilizes a period during which data is not received, namely non-reception period TOFF.

Frequency adjusting circuit 18 detects extraneous reception state signal 27 indicating whether in reception period TON or non-reception period TOFF; holds digital data in register 23; converts the digital data to a control voltage with digital-to-analog converter 24; and inputs the control voltage to filter 12. This arrangement prevents deterioration of the signal waveform of a symbol, by setting the timing for switching the signal for controlling the frequency characteristic of filter 12, to an arbitrary period between symbol periods such as non-reception period TOFF.

Fourth Exemplary Embodiment

Figure 7:
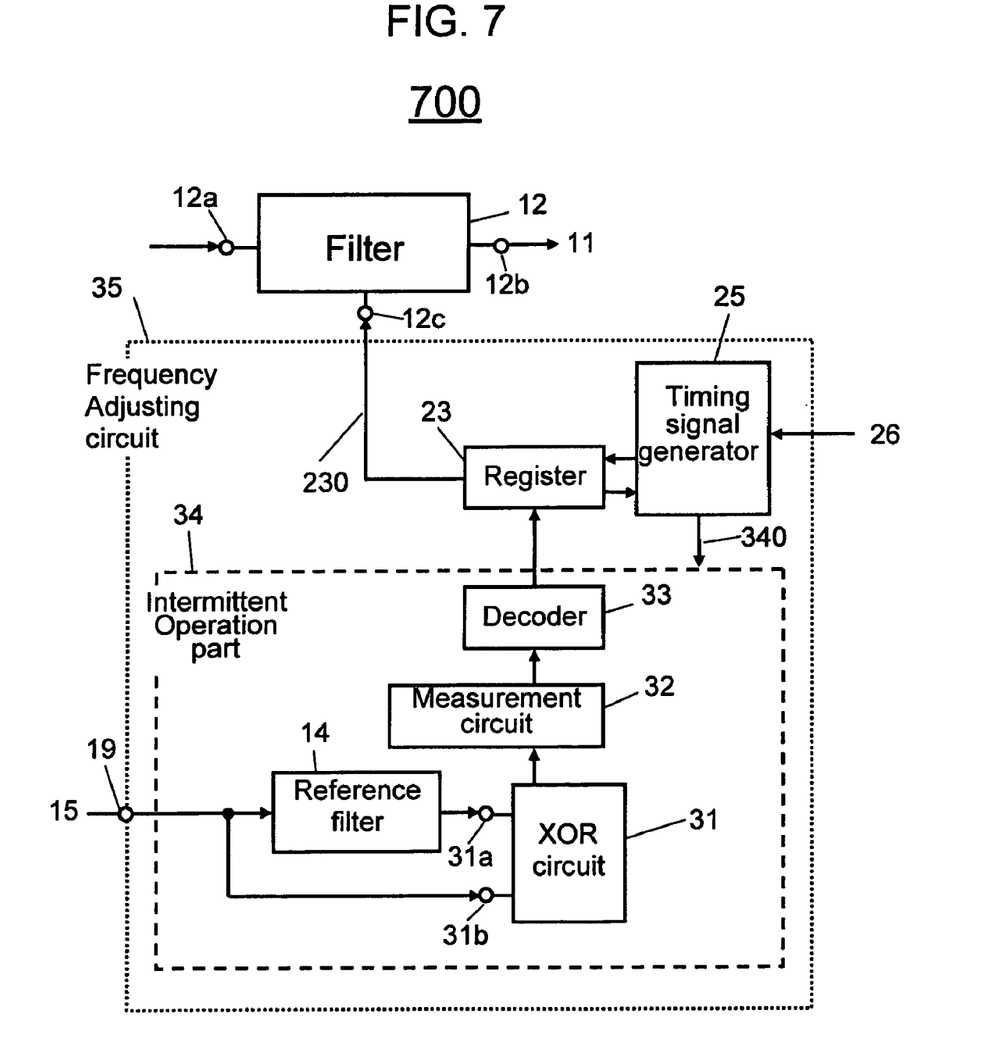
FIG. 7 is a block diagram of a receiver incorporating a frequency adjusting circuit according to the fourth exemplary embodiment of the present invention.

A description is made of the fourth exemplary embodiment with reference to the related drawings. FIG. 7 is a block diagram of a receiver incorporating a filter according to the fourth embodiment of the present invention and its frequency adjusting circuit.

Receiver 700 according to the fourth exemplary embodiment has filter 12 and frequency adjusting circuit 35.

Filter 12, made of a gm-C filter, has input terminal 12a to which an input signal is supplied; and output terminal 12b from which an output signal that is the input signal the frequency characteristic of which has been adjusted is extracted. Filter 12 further has control terminal 12c to which a control voltage for adjusting the frequency characteristic is supplied from frequency adjusting circuit 35. A control voltage for adjusting the frequency characteristic is input to control terminal 12c from register 23 to be described later.

Frequency adjusting circuit 35 has intermittent operation part 34. Intermittent operation part 34 has input terminal 19, reference filter 14, XOR circuit 31, measurement circuit 32, and decoder 33.

Intermittent operation part 34 has reference filter 14 for phase-shifting reference clock signal 15 fed into input terminal 19; and XOR circuit 31 for outputting a signal that is an exclusive OR of a phase-shifted signal and the reference clock signal. XOR circuit 31 further has first input terminal 31a connected to reference filter 14; and second input terminal 31b directly connected to input terminal 19.

Intermittent operation part 34 is further composed of measurement circuit 32 for measuring the duty ratio of an output signal extracted from XOR circuit 31; decoder 33 for converting the measurement result to a control signal for controlling filter 12; register 23 for holding the control signal from decoder 33 as digital data; and timing signal generator 25 for generating a timing signal for controlling intermittent operation part 34 and register 23, from multiple digital data held in register 23 and extraneous guard interval signal 26 indicating whether or not in a reception period. Here, the term "duty ratio" refers to a ratio of a Hi-level output signal period to a Lo-level output signal.

Frequency adjusting circuit 35 further has register 23 and timing signal generator 25. Timing signal generator 25 is supplied with guard interval signal 26 mentioned in the first and second exemplary embodiments.

Figure 8:
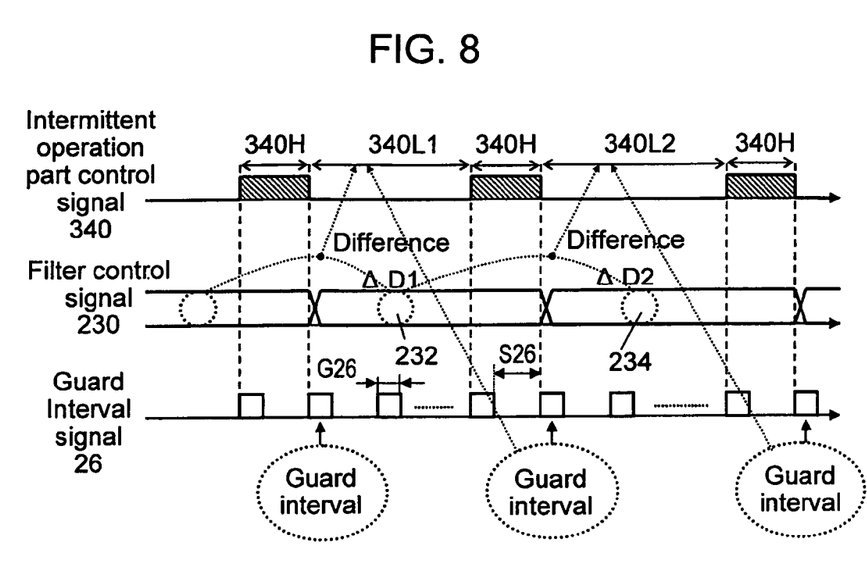
FIG. 8 is a timing chart of the receiver incorporating the frequency adjusting circuit according to the fourth exemplary embodiment of the present invention.

FIG. 8 is an operation timing chart of receiver 700 shown in FIG. 7. Intermittent operation part control signal 340 is output from timing signal generator 26. The actions of intermittent operation part 34 are controlled following an on/off state of intermittent operation part control signal 340. Intermittent operation part 34 is on during on period 130H (Hi level) and is off during off period 130L (Lo level), of intermittent operation part control signal 130.

Filter control signal 230 is a signal for selecting a desired resistor out of those with different resistances, in a circuit where filter 12 switches the resistance to change the frequency characteristic, for example. If 64 levels of resistances can be set, values 232, 234 of filter control signal 230 shown in FIG. 8 take 0 through 63. The filter control signal fed into filter 12 and the immediately preceding one are used to calculate change amounts ΔD1, ΔD2 of filter control signal 230. Off period 340L1 is to be set short for large ΔD1; and long for small ΔD1. Meanwhile, the same idea applies to change amount ΔD2 of filter control signal 230. That is, off period 340L2 is to be set short for large ΔD2; and long for small ΔD2. Here, an example of a method of extracting off periods 340L1, 340L2 from the change amount of a filter control signal, involves preparing a setting table showing correlation between off periods and change amounts of the filter control signal. Although the case of switching the resistance is taken as an example, the same idea applies to switching the capacitance of a capacitor or the inductance of a coil.

A description is made of the actions of frequency adjusting circuit 35 using the timing chart of FIG. 8. Intermittent operation part control signal 340 switches the operating state of intermittent operation part 34. While intermittent operation part 34 is in an on state, the duty ratio of an output signal is measured that is an exclusive OR of a signal phase-shifted by reference filter 14, and reference clock signal 15 supplied from input terminal 19. The duty ratio of the output signal supplied from XOR circuit 31 is determined by the product of the resistance of a resistor by the capacitance of a capacitor, incorporated in reference filter 14; and reference clock signal 15. Accordingly, if reference clock signal 15 is constant, monitoring the duty ratio allows monitoring of fluctuations in the product of the resistance by the capacitance. Consequently, preparing a table for correction values of the resistance or capacitance, relative to duty ratios, allows adjusting of the frequency characteristic of filter 12, by incorporating a correction value corresponding to a duty ratio into filter 12e.

In this way, decoder 33 generates a control signal for filter 12 from the duty ratio of an output signal. Timing for controlling filter 12 utilizes guard interval G26 adopted in such as digital terrestrial television broadcasting. Guard interval G26 is defined as "arbitrary time interval" described herein. Here, this "arbitrary time interval" may be either constant or variable. Adopting either makeup in the above prevents deterioration of the signal waveform of a symbol, by setting the timing for switching the signal for controlling the frequency characteristic of filter 12, to an arbitrary period between symbol periods such as guard interval G26.

Filter control signal 230 is a signal for selecting a desired resistor out of those with different resistances, in a circuit where filter 12 switches the resistance to change the frequency characteristic, for example. If 64 levels of resistances can be set, values 232, 234 of filter control signal 230 shown in FIG. 8 take 0 through 63. The filter control signal fed into filter 12 and the immediately preceding one are used to calculate change amounts ΔD1, ΔD2 of filter control signal 230. Off period 340L1 is to be set short for large ΔD1; and long for small ΔD1. Meanwhile, the same idea applies to change amount ΔD2 of filter control signal 230. That is, off period 340L2 is to be set short for large ΔD2; and long for small ΔD2. Here, an example of a method of extracting off periods 340L1, 340L2 from the change amount of a filter control signal, involves preparing a setting table showing correlation of off periods to change amounts of the filter control signal. Although the case of switching the resistance is taken as an example, the same idea applies to switching the capacitance of a capacitor and the inductance of a coil.

Guard interval signal 26 shown in FIG. 8 is the same as those adopted in the first exemplary embodiment (FIG. 2) and the second exemplary embodiment (FIG. 4). That is, guard interval signal 26 is fed into timing signal generator 25. Guard interval signal 26 has effective symbol period S26 and guard interval G26. A symbol period is defined as (S26+G26), which is a sum of effective symbol period S26 and guard interval G26. Here, a symbol period is a period for data of one or more bits transmittable in one modulation.

Timing signal generator 25 may receive an output signal supplied from filter 12; turn on the power supply of intermittent operation part 13 before a given period to the guard interval of the output signal; and turn off the power supply of intermittent operation part 13 after intermittent operation part 13 completes controlling filter 12. This brings lower power consumption of intermittent operation part 13.

Further, timing signal generator 25 may detect guard interval G26 of guard interval signal 26 externally supplied; hold the digital data by register 23 synchronously with the guard interval G26; and input a control voltage to filter 12 by DAC 24. This allows intermittent operation part 13 to supply filter 12 with a control signal even during a period during which intermittent operation part 13 is off.

A receiver incorporating a filter frequency adjusting circuit according to the present invention offers a particular advantage of suppressing deterioration of the signal waveform of a symbol, and is useful for electronic devices such as a mobile terminal capable of receiving digital terrestrial television broadcasting, and an in-car television set, and thus has wide industrial applicability.

The invention claimed is:

1. A receiver comprising:
   a filter that sends out an output signal having a symbol at an arbitrary time interval;
   an intermittent operation part that controls the filter intermittently at the time interval, according to the output signal supplied from the filter; and
   a timing signal generator that generates a timing signal for turning on and off a power supply of the intermittent operation part, according to the arbitrary time interval in the output signal supplied from the filter.

2. The receiver as claimed in claim 1, wherein the timing signal generator generates a timing signal for turning on and off the power supply of the intermittent operation part, according to the control signal from the intermittent operation part.

3. The receiver as claimed in claim 2, wherein the timing signal generator generates a timing signal for turning on and off the power supply of the intermittent operation part, according to a control signal from the intermittent operation part and an off period of the power supply of the intermittent operation part.

4. The receiver as claimed in claim 1, wherein the timing signal generator generates a timing signal for turning on and off the power supply of the intermittent operation part, according to signal strength of the control signal from the intermittent operation part.

5. The receiver as claimed in claim 4, wherein the timing signal generator generates a timing signal for turning on and off the power supply of the intermittent operation part, according to a control signal from the intermittent operation part and an off period of the power supply of the intermittent operation part.

6. The receiver as claimed in claim 1, wherein the timing signal generator generates a timing signal for turning on and off the power supply of the intermittent operation part, according to a reference clock in addition to the arbitrary time interval in the output signal.

7. An electronic device loaded with the receiver as claimed in claim 1.

8. A receiver comprising:
   a filter that sends out an output signal having a symbol at an arbitrary time interval;
   an intermittent operation part that controls the filter intermittently at the time interval, according to the output signal supplied from the filter; and
   a register that holds a control signal from the intermittent operation part,
   wherein the filter is controlled according to the control signal held by the register.

9. An electronic device loaded with the receiver as claimed in claim 8.

10. A frequency adjusting circuit comprising:
    a reference filter that sets a phase difference to a reference clock signal;
    a multiplication circuit that multiplies the output signal supplied from the reference filter by the reference clock signal;
    a low-pass filter that is connected to an output of the multiplication circuit, the frequency adjusting circuit providing the reference filter with an output voltage supplied from the low-pass filter, to provide the reference filter with negative feedback, so that a cutoff frequency of the reference filter remains constant;

a sample hold circuit that holds an output voltage supplied from the low-pass filter for a constant period;

an analog-to-digital converter that converts an output voltage supplied from the sample hold circuit to digital data;

a digital-to-analog converter that converts the digital data to an analog adjusted value; and a register that holds the digital data converted, wherein the frequency adjusting circuit is operated intermittently according to the digital data held by the register.

* * * * *